United States Patent
Hussain et al.

(10) Patent No.: US 11,854,603 B2
(45) Date of Patent: Dec. 26, 2023

(54) LOGICAL TO ENCODED VALUE TABLE IN DATA STORAGE DEVICE

(71) Applicant: Western Digital Technologies, Inc., San Jose, CA (US)

(72) Inventors: Atif Hussain, Longmont, CO (US); Vivek Shivhare, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 195 days.

(21) Appl. No.: 17/540,682

(22) Filed: Dec. 2, 2021

(65) Prior Publication Data

US 2023/0178143 A1    Jun. 8, 2023

(51) Int. Cl.
*G11C 16/04*    (2006.01)
*G11C 11/408*    (2006.01)
*G06F 12/02*    (2006.01)
*H03K 19/17728*    (2020.01)

(52) U.S. Cl.
CPC ...... *G11C 11/4087* (2013.01); *G06F 12/0246* (2013.01); *G11C 11/4085* (2013.01); *H03K 19/17728* (2013.01); *G06F 2212/7201* (2013.01)

(58) Field of Classification Search
CPC ................................................. G11C 16/0466
See application file for complete search history.

(56) References Cited

U.S. PATENT DOCUMENTS

| | | | |
|---|---|---|---|
| 7,948,823 B2 | 5/2011 | Yun et al. | |
| 8,947,961 B2 | 2/2015 | Kuo et al. | |
| 10,565,123 B2 | 2/2020 | Song et al. | |
| 2002/0145907 A1* | 10/2002 | Byeon | G11C 29/02 365/185.11 |
| 2018/0239697 A1 | 8/2018 | Huang et al. | |
| 2020/0192814 A1 | 6/2020 | Hanna et al. | |
| 2020/0371908 A1 | 11/2020 | Cariello | |

* cited by examiner

*Primary Examiner* — Jason Lappas
(74) *Attorney, Agent, or Firm* — Michael Best & Friedrich LLP (57) ABSTRACT

A data storage device including, in one implementation, a memory device and a controller configured to configured to retrieve a plurality of physical memory addresses from a first lookup table in the non-volatile memory. Each physical memory address is a combination of a word line and a string number of the non-volatile memory and the each physical memory address has a first number of bits. The controller is further configured to generate a plurality of encoded values by encoding the plurality of physical memory addresses. Each of the plurality of encoded values has a second number of bits that is smaller than the first number of bits. The controller is further configured to store the plurality of encoded values in the first lookup table, generate a logical to encoded value look-up table with the plurality of encoded values, and store the logical to encoded value look-up table in the memory.

20 Claims, 5 Drawing Sheets

| WL 201 | STR 202 | WL [7:0] 204 | STR [2:0] 206 | Used? 208 |
|---|---|---|---|---|
| 0 | 0 | 00000000 | 000 | Used |
| 0 | 1 | 00000000 | 001 | Used |
| 0 | 2 | 00000000 | 010 | Used |
| 0 | 3 | 00000000 | 011 | Used |
| 0 | 4 | 00000000 | 100 | Used |
| 0 | 5 | 00000000 | 101 | Not Used |
| 0 | 6 | 00000000 | 110 | Not Used |
| 0 | 7 | 00000000 | 111 | Not Used |
| 1 | 0 | 00000001 | 000 | Used |
| 1 | 1 | 00000001 | 001 | Used |
| ... | ... | ... | ... | ... |
| 1 | 5 | 00000001 | 101 | Not Used |
| 1 | 6 | 00000001 | 110 | Not Used |
| 1 | 7 | 00000001 | 111 | Not Used |
| ... | ... | ... | ... | ... |
| 159 | 0 | 10011111 | 000 | Used |
| 159 | 1 | 10011111 | 001 | Used |
| ... | ... | ... | ... | ... |
| 159 | 4 | 10011111 | 100 | Used |
| 159 | 5 | 10011111 | 101 | Not Used |
| 160 | 0 | 10100000 | 000 | Not Used |
| 160 | 1 | 10100000 | 001 | Not Used |
| ... | ... | ... | ... | ... |
| 160 | 5 | 10100000 | 101 | Not Used |
| ... | ... | ... | ... | ... |
| 255 | 7 | 11111111 | 111 | Not Used |

FIG. 2

| First Lookup Table 120 | | | | | |
|---|---|---|---|---|---|
| Encoded Value 210 | WL 201 | STR 202 | WL [7:0] 204 | STR [2:0] 206 | Used? 208 |
| 0 | 0 | 0 | 00000000 | 000 | Used |
| 1 | 0 | 1 | 00000000 | 001 | Used |
| 2 | 0 | 2 | 00000000 | 010 | Used |
| 3 | 0 | 3 | 00000000 | 011 | Used |
| 4 | 0 | 4 | 00000000 | 100 | Used |
| X | 0 | 5 | 00000000 | 101 | Not Used |
| X | 0 | 6 | 00000000 | 110 | Not Used |
| X | 0 | 7 | 00000000 | 111 | Not Used |
| 5 | 1 | 0 | 00000001 | 000 | Used |
| 6 | 1 | 1 | 00000001 | 001 | Used |
| ... | ... | ... | ... | ... | ... |
| X | 1 | 5 | 00000001 | 101 | Not Used |
| X | 1 | 6 | 00000001 | 110 | Not Used |
| X | 1 | 7 | 00000001 | 111 | Not Used |
| ... | ... | ... | ... | ... | ... |
| 795 | 159 | 0 | 10011111 | 000 | Used |
| 796 | 159 | 1 | 10011111 | 001 | Used |
| ... | ... | ... | ... | ... | ... |
| 799 | 159 | 4 | 10011111 | 100 | Used |
|  | 159 | 5 | 10011111 | 101 | Not Used |
|  | 160 | 0 | 10100000 | 000 | Not Used |
|  | 160 | 1 | 10100000 | 001 | Not Used |
|  | ... | ... | ... | ... | ... |
|  | 160 | 5 | 10100000 | 101 | Not Used |
|  | ... | ... | ... | ... | ... |
|  | 255 | 7 | 11111111 | 111 | Not Used |

LOGICAL TO ENCODED VALUE TABLE IN DATA STORAGE DEVICE

FIELD

This application relates generally to data storage devices and, more particularly, to a logical to encoded value look-up table in a data storage device.

BACKGROUND

Data storage devices include flash memory devices and other storage devices. In a flash memory, logical addresses are stored in a memory unit. The logical addresses undergo translation into physical memory addresses, creating entries that are then stored in the data storage device, and, in particular, in a double data rate (DDR) memory. The physical memory addresses of the entries include word lines and strings that are used as variables to address the memory in the data storage device. Optimization of the number of entries and addressing the entries is a difficult task.

SUMMARY

In many cases of data storage device, each physical memory address may not be used, thus causing an inefficient use of DDR memory. For example, only some physical memory addresses may include data. Traditional data storage device with a physical capacity of 2 terabytes (TB), 4 TB, 8 TB, 16 TB, 32 TB, and 64 TB requires 11 bits of space for each memory block but fails to use all of bits. Additionally, traditional physical addresses requires 8 bits of space for word lines (e.g., 0 to 159 word lines) and 3 bits of space for strings (e.g., 0 to 4 numbers of strings). However, only 10 bits are actually utilized because only 160 word lines and 5 string numbers are present. When combined and encoded together, 800 (e.g., 160×5=800 (0 to 799)) spaces are required. Thus, the required number of spaces may be represented by 10 bits of space for each memory block. Accordingly, the present disclosure creates a lookup table with encoded values that correspond to the word lines and string numbers that are utilized by the data storage device and is smaller in size than a conventional logical to physical (L2P) table.

One embodiment of the present disclosure includes a data storage device. The data storage device includes a non-volatile memory device and a controller, including a memory and an electronic processor, coupled to the non-volatile memory device. The controller is configured to retrieve a plurality of physical memory addresses from a first lookup table in the non-volatile memory. Each physical memory address is a combination of a word line and a string number of the non-volatile memory and the each physical memory address has a first number of bits. The controller is further configured to generate a plurality of encoded values by encoding the plurality of physical memory addresses. Each of the plurality of encoded values has a second number of bits that is smaller than the first number of bits. The controller is further configured to store the plurality of encoded values in the first lookup table, generate a logical to encoded value look-up table with the plurality of encoded values, and store the logical to encoded value look-up table to the memory.

Another embodiment of the present disclosure is a method. The method comprises retrieving, with a data storage controller, a plurality of physical memory addresses from a first lookup table in a non-volatile memory. Each physical memory address is a combination of a word line and a string number of the non-volatile memory, the each physical memory address has a first number of bits. The method further comprises generating, with the data storage controller, a plurality of encoded values by encoding the plurality of physical memory addresses, each of the plurality of encoded values has a second number of bits that is smaller than the first number of bits. The method further comprises storing, with the data storage controller, the plurality of encoded values in the first lookup table, generating, with the data storage controller, a logical to encoded value look-up table with the plurality of encoded values, and storing, with the data storage controller, the logical to encoded value look-up table to a memory of the data storage controller.

In another embodiment of the present disclosure, a non-transitory computer readable medium including instructions that, when executed by a data storage controller, causes the data storage controller to execute a set of operations is provided. The set of operations include retrieving a plurality of physical memory addresses from a first lookup table in a non-volatile memory. Each physical memory address is a combination of a word line and a string number of the non-volatile memory, the each physical memory address has a first number of bits. The set of operations further includes generating a plurality of encoded values by encoding the plurality of physical memory addresses. Each of the plurality of encoded values has a second number of bits that is smaller than the first number of bits. The set of operations further includes storing the plurality of encoded values in the first lookup table, generating a logical to encoded value look-up table with the plurality of encoded values, and controlling a memory of the data storage controller to store the logical to encoded value look-up table.

Various aspects of the present disclosure provide for improvements in memory devices. For example, optimizing bits of space in a memory reduces the required space for memory in the DDR, thus, allotting additional space for components that are saved in DDR. As another example, the absolute DDR necessary may be reduced, thus, reducing the cost of producing DDR for a memory. The present disclosure can be embodied in various forms, including hardware or circuits controlled by software, firmware, or a combination thereof. The foregoing summary is intended solely to give a general idea of various aspects of the present disclosure and does not limit the scope of the present disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the controller can be performed by hardware (for example, analog or digital circuits), a combination of hardware and software (for example, program code or firmware stored in a non-transitory computer-readable medium that is executed by a processor or control circuitry), or any other suitable means. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, etc.

Figure 1:
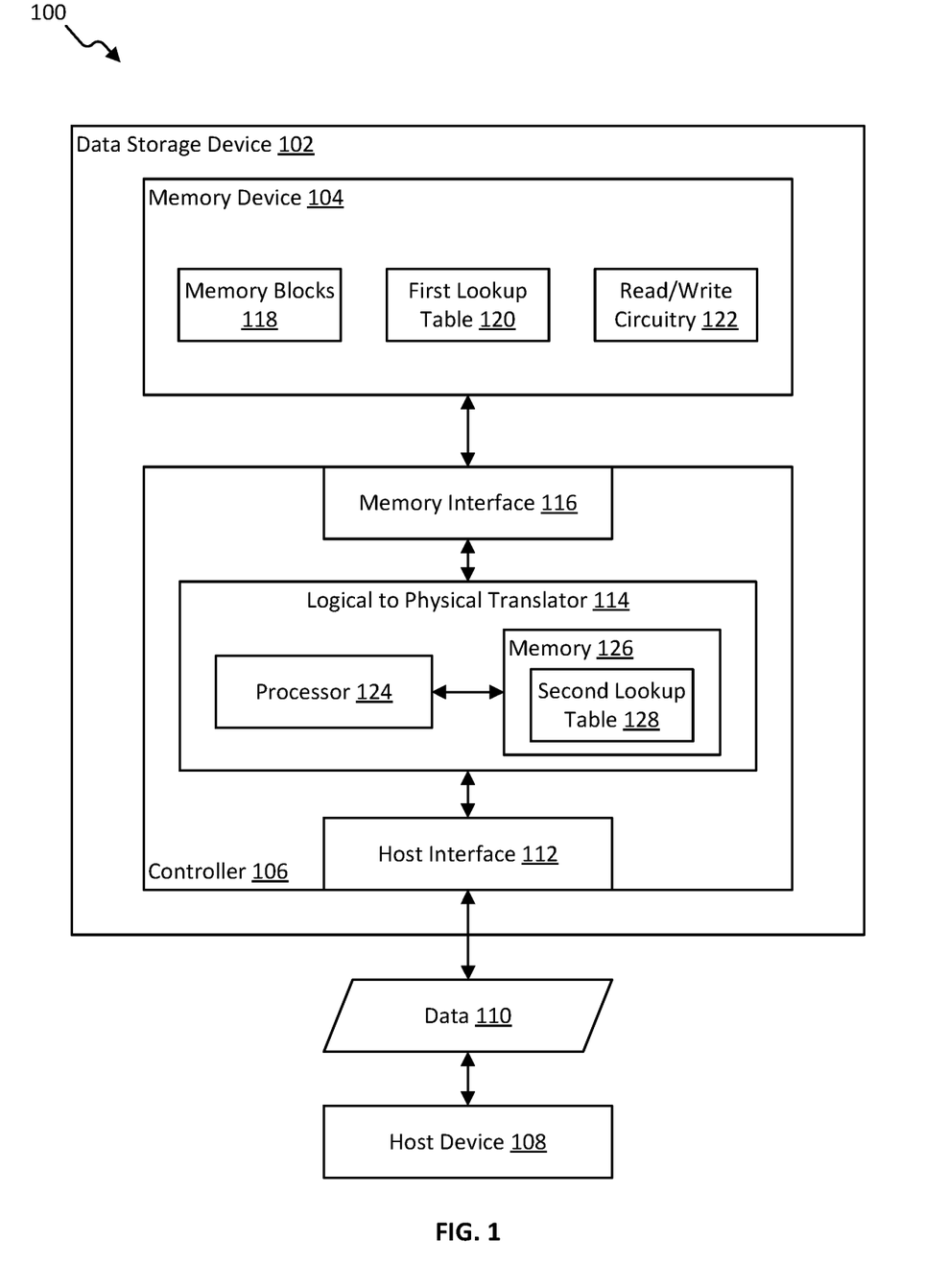
FIG. 1 is a block diagram of one example of a system including a data storage device, according to some embodiments.

FIG. 1 is a block diagram of one example of a system 100 that includes a lookup table for optimizing physical memory address of memory blocks in memory, in accordance with some embodiments of the disclosure. In the example of FIG. 1, the system 100 includes a data storage device 102 in communication with a host device 108. The data storage device 102 includes a memory device 104 (e.g., non-volatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled via a connection, such as a bus or a wireless connection to transfer data 110 to one another. In some examples, the data storage device 102 may be embedded within the host device 108.

Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 108 via the communication path, such as a wired communication path and/or a wireless communication path, to exchange data 110. For example, the data storage device 102 may include an interface (e.g., a host interface 112) that enables communication via the communication path between the data storage device 102 and the host device 108, such as when the host interface 112 is communicatively coupled to the host device 108.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide a plurality of logical addresses to be used in a logical to physical (L2P) lookup table, or as described herein a logical to encoded value lookup table. Additionally, the host device 108 may be configured to provide data 110, such as user data, to be stored at a physical memory address in the data storage device 102 or to request data to be read from the physical memory address in the data storage device 102 using the logical to encoded value look table. The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates via a memory interface 116 that enables reading from the memory device 104 and writing to the memory device 104. In some examples, the host device 108 may operate in compliance with an industry specification, such as a Universal Flash Storage (UFS) Host Controller Interface specification. In other examples, the host device 108 may operate in compliance with one or more other specifications, such as a Secure Digital (SD) Host Controller specification or other suitable industry specification. The host device 108 may also communicate with the memory device 104 in accordance with any other suitable communication protocol.

The memory device 104 of the data storage device 102 may include a non-volatile memory (e.g., DDR, NAND, BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies. Each of the one or more memory dies may include one or more memory blocks 118 (e.g., one or more erase blocks). Each memory block 118 may include one or more groups of storage elements. The group of storage elements may be configured as a word line. The group of storage elements may include multiple storage elements (e.g., memory cells that are referred to herein as a "string"). Each string may include a string number. In some embodiments, the word line and string number are separate components associated with a memory block 118 that correspond to the physical memory address of the memory block 118 in the memory device 104. In some embodiments, the word line requires 8 bits (e.g., 0 to 159 word lines) and the string requires 3 bits of space (e.g., 0 to 4 numbers of strings).

The memory device 104 may include support circuitry, such as read/write circuitry 122 to support operation of the one or more memory blocks 118. Although depicted as a single component, the read/write circuitry 122 may be divided into separate components of the memory device 104, such as read circuitry and write circuitry. The read/write circuitry 122 may be external to the one or more memory blocks 118 of the memory device 104. Alternatively, one or more individual memory blocks may include corresponding read/write circuitry that is operable to read from and/or write to storage elements within the individual memory die independent of any other read and/or write operations at any of the other memory dies.

The memory device 104 may also include a first lookup table 120. The first lookup table 120 may include a mapping of encoded values to physical memory addresses of memory blocks 118 within the memory device 104. Although depicted in FIG. 1 as being separate from the read/write circuitry 122, the first lookup table 120 may be included in the read/write circuitry 122. The first lookup table 120 will be described in detail below with respect to FIG. 3.

The controller 106 is coupled to the memory device 104 via a bus, an interface (e.g., memory interface 116), another structure, or a combination thereof. For example, the bus may include multiple distinct channels to enable the controller 106 to communicate with each of the one or more memory blocks 118 in parallel with, and independently of, communication with the other memory blocks 118.

The controller 106 is configured to receive data and instructions from the host device 108 and to send data to the host device 108. For example, the controller 106 may send data to the host device 108 via the interface 112, and the controller 106 may receive data from the host device 108 via the interface 112. The controller 106 is configured to send data and commands to the memory device 104 and to receive data from the memory device 104. For example, the controller 106 is configured to send data and a program or write command to cause the memory device 104 to store data to a specified address of the memory device 104. The write command may specify a physical memory address of a portion of the memory device 104 (e.g., a physical memory address of a word line and a string of the memory device 104) that is to store the data.

The controller 106 is configured to send a read command to the memory device 104 to access data from a specified physical memory address of the memory device 104. The controller 106 may reference the first lookup table 120 to determine a physical memory address of the data in the memory device 104 based on the encoded value that corresponds to the logical address of the data. For example, the controller 106 may determine the encoded value from a second lookup table 128 that corresponds to a logical address of the requested data. The controller 106 may then reference the first lookup table 120 to determine the physical memory address of the data that corresponds to the encoded value. Alternatively, the controller 106 may output the encoded value to the read/write circuitry 122 that may then reference the first lookup table 120 to determine the physical memory address of the data that corresponds to the encoded value.

Encoded values are assigned to word lines and strings that are used by the memory device 104 (i.e., physical memory address in the memory device 104 that are used/configured to be used). Encoded values will be described in detail below with respect to FIG. 3. The controller 106 may also be configured to send data and commands to the memory device 104 associated with background scanning operations, garbage collection operations, and/or wear leveling operations, or other suitable memory operations.

The controller 106 may include a logical to physical (L2P) translator 114 for translating a logical address of data (i.e., an address generated by the controller 106) to a physical memory address in the memory device 104. The L2P translator 114 includes a processor 124, a memory 126, and other associated circuitry. The memory 126 may be configured to store data and/or instructions that may be executable by the processor 124. The memory 126 may include translation commands for translating logical addresses to physical memory addresses. The commands may be hardware circuits or instructions that are executable by the processor 124. The memory 126 includes the second lookup table 128. The second lookup table 128 includes a mapping of the logical addresses to encoded values. The processor 124 determines the encoded value(s) corresponding to the logical address of data that may be written to/read from and references the first lookup table 120 in the memory device 104 using the encoded value(s) to determine a physical memory address of the data (e.g., the word line and string number). The controller 106 may then send a read command to the memory device 104 to cause the read/write circuitry 122 to sense data stored at the physical memory address.

In other examples, the controller 106 may reference the second lookup table 128 to determine the encoded value corresponding to the logical address of the sensed data and then send the read command to the memory device 104 along with the encoded value in response to receiving a request for read access from the host device 108. In response to receiving the read command, the memory device 104 may reference the first lookup table 120 to determine the physical memory address of the stored data based on the encoded value. The encoded values correspond to a word line and string number (i.e., the physical memory address) of data that is used within the memory device 104. In some embodiments, only 10 bits of space per memory block 118 is needed to store the encoded value that corresponds to a word line and string value for data that is used in comparison to 11 bits of space needed to store the word line and string number for unused memory blocks 118, thus, saving space in the memory 126 due to the second lookup table 128 only requiring 10 bits of space in comparison to the 11 bits that is typically required.

Figure 2:
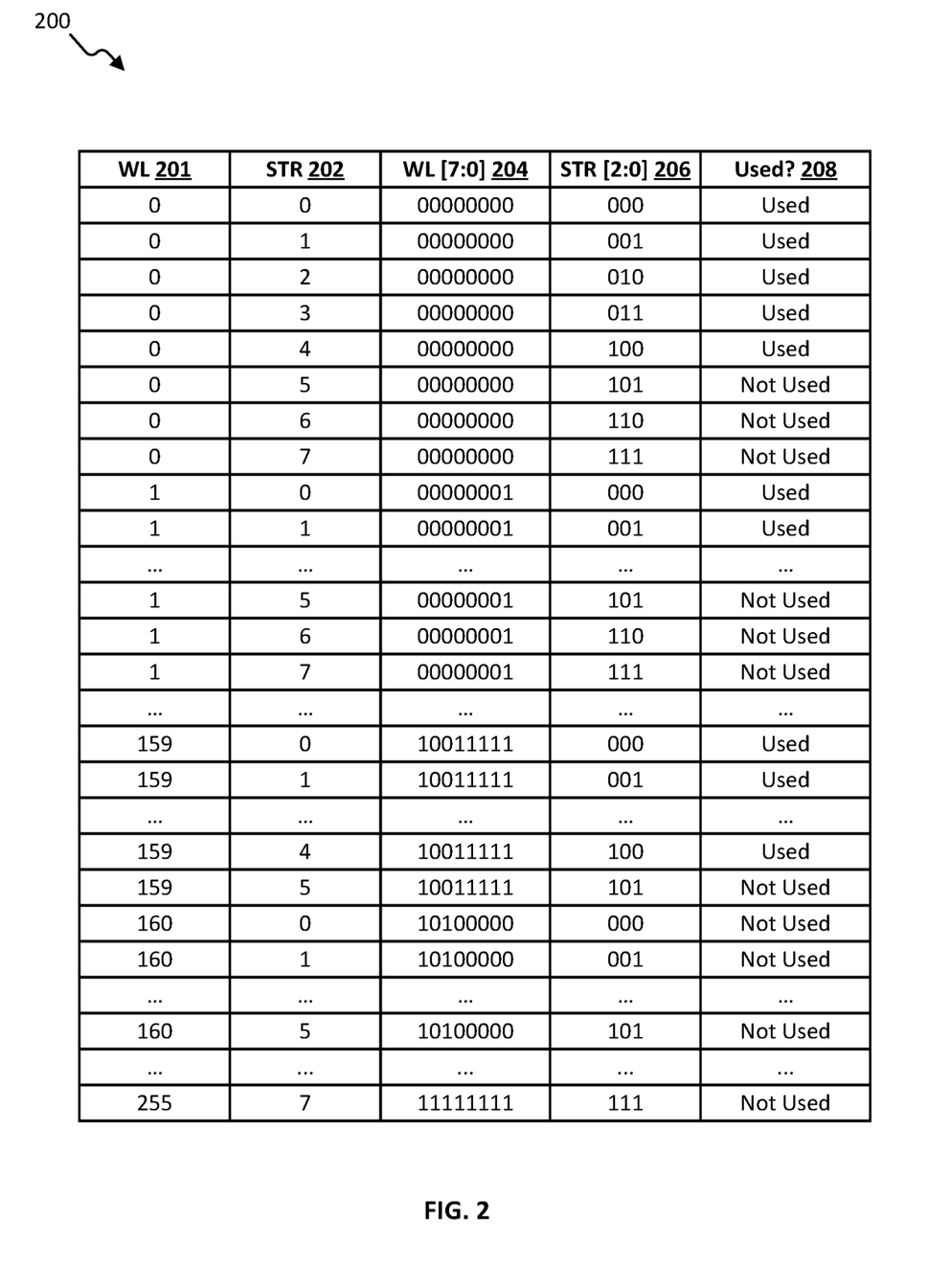
FIG. 2 is a diagram illustrating a traditional mapping of physical memory addresses of memory blocks, according to some embodiments.

Turning now to FIG. 2, an example mapping 200 illustrating traditional physical memory addresses of memory blocks 118 is shown, according to some embodiments. As shown in FIG. 2, memory blocks may be located in a memory device 104 based on their physical memory address. The physical memory address includes an 8 bit word line 201 and a 3 bit string number 202 requiring 11 bits of space in the memory device 104. The word line 201 and string number 202 are represented by binary numbers in entry columns 204 and 206, respectively. As evidenced by a used column 208, each location in the mapping 200 may or may not be used. In some embodiments, a row with "Used" signifies a location in the mapping 200 that is used or will be used. Additionally, in these embodiments, a row with "Not Used" signifies a location in the mapping 200 that will not be used, and is therefore considered to be extraneous space in the memory device 104 since that physical memory address is unused. For example, the physical memory address at WL 00000000 (e.g., "0" at word line 201) STR 101 (e.g., "5" at string number 202), is unused, as denoted by the "Not Used" entry in the used column 208 and, thus, the physical memory address at WL 00000000 STR 101 is extraneous space in the memory device 104, since it is unused. In some embodiments, each entry at a physical memory address in the mapping 200 may contain 32 bytes of data. For example, when the memory device 104 accommodates 11 bits of data, 65,536 bytes of data is necessary to store the physical memory addresses of the mapping 200, regardless of the use status of the physical memory address entries, requiring 2,048 physical memory address entries.

Figure 3:
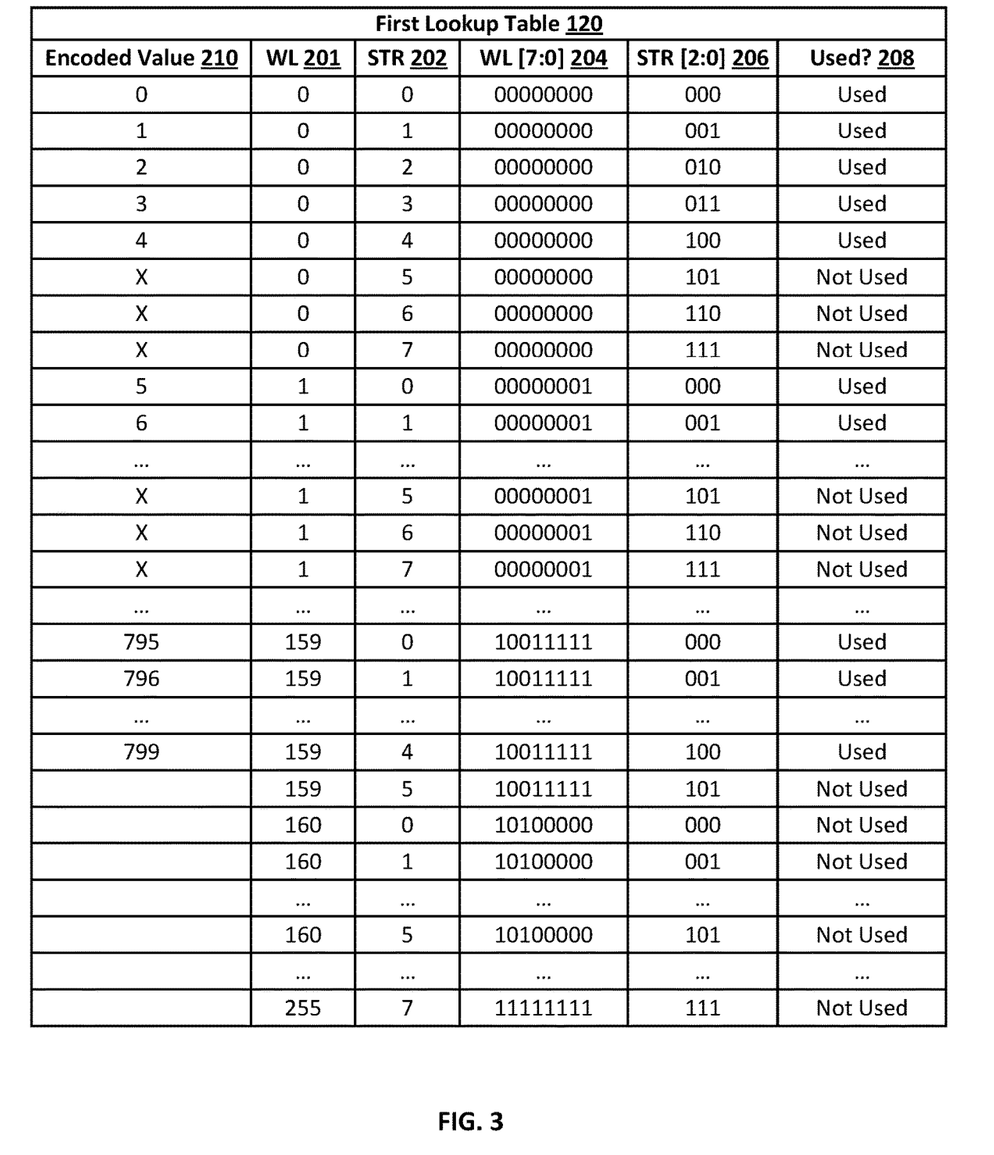
FIG. 3 is a diagram illustrating a first lookup table for the physical memory addresses of memory blocks, according to some embodiments.

Turning now to FIG. 3, the first lookup table 120 is shown, according to some embodiments. As shown in FIG. 3, the first lookup table 120 includes the mapping 200 with an additional encoded value column 210. The encoded value column 210 provides the encoded values of word lines and strings needed for a physical location that is used in the mapping 200. In some embodiments, the necessary number of word lines and string numbers is represented by a decimal number in the encoded value column 210. For example, the physical memory address at WL 00000000 (e.g., "0" at word line 201) STR 100 (e.g., "4" at string number 202) corresponds to encoded value 4 (e.g., "4" in encoded value column 210). Encoded values are not provided for unused entries (e.g., rows including "Not Used" in the used column 208). In some embodiments, the encoded value column 210 provides an encoded value for 800 bits of used memory blocks in the memory device 104.

As shown in FIG. 3, an encoded value is only provided for used entries. For example, at the fifth location in the physical mapping (e.g., "0" at word line 201, "5" at sting number 202) an encoded value is not provided. The encoded value may not be a one to one mapping of the physical memory addresses based on the actual amount of used entries in the first lookup table 120. In some embodiments, using the encoded values in the second lookup table 128 reduces the number of bits needed from 11 bits (e.g., needed by the first lookup table 120) to 10 bits. Mapping to encoded values alleviates the need for physical memory address corresponding to unused entries, thus saving space in the memory device 104. For example, when 10 bits of data is needed, 800 physical memory address entries are used in the memory 126 which requires 25,600 bytes of data. Accordingly, in some embodiments, the second lookup table 128 saves 6,400 bytes of space in the memory 126. Saving space in the memory 126 reduces the overall price of the data storage device 102.

In some embodiments, depending on the capacity of a memory device (e.g., 2 TB, 4 TB, 8 TB, 16 TB, 32 TB, and 64 TB) the encoded values may shift to accommodate either a decreased or an increased number of used entries. For example, in some embodiments, encoded value 5 may be provided at WL 00000000 (e.g., "0" at word line 201) STR 101 (e.g., "5" at string number 202) when the entry is used (e.g., "Used" in the used column 208). The encoded values may have an upper limit of 10 bits. For example, the upper limit of a physical memory address that may be mapped to using an encoded value is WL 00110010 STR 000 when each entry is used, providing a maximum of 800 used physical memory address entries in the memory device 104.

Figure 4:
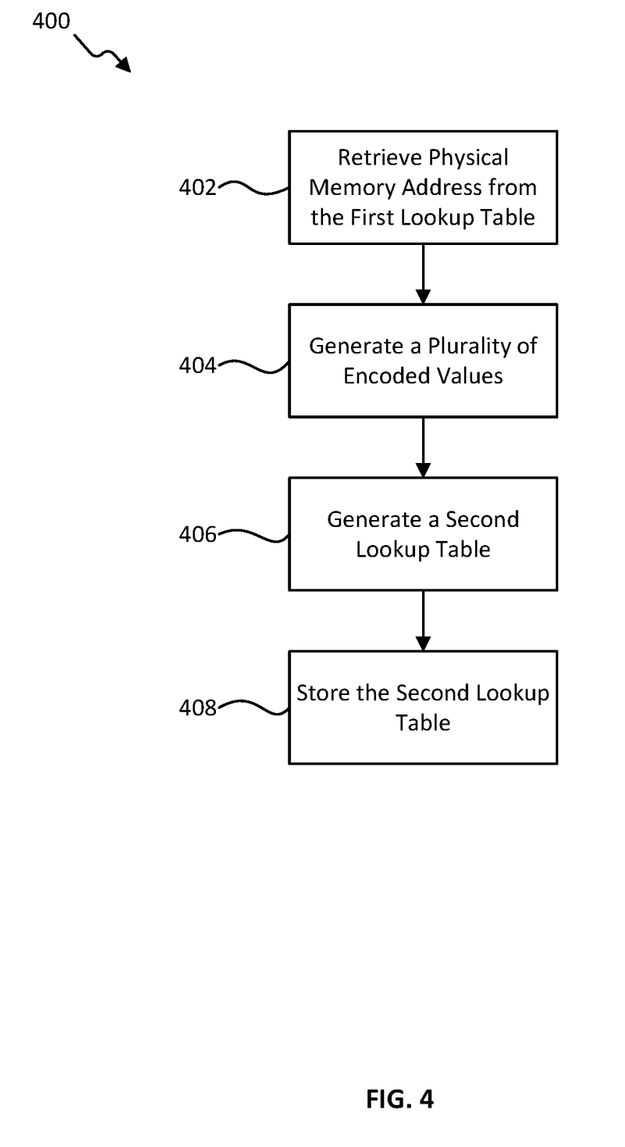
FIG. 4 is a flowchart illustrating a process for creating a second lookup table, according to some embodiments.

Turning now to FIG. 4, a process or method 400 for creating the second lookup table 128 will be described, according to some embodiments. It is understood that the process 400 may instructions stored in a memory, such as memory 126, and executed by a processor, such as processor 124. However, it is contemplated that some or all of the process 400 may be performed on the memory device 104, such as via the read/write circuitry 122. Accordingly, while the process 400 is described in regards to the controller 106 and its associated components described above, it is contemplated that the process 400 may be at least partially performed by the memory device 104 or other suitable memory component.

A processor, such as the processor 124 described above, retrieves a plurality of physical memory addresses from a first lookup table, such as first lookup table 120 described above (at block 402). In some embodiments, the first lookup table 120 includes a mapping, such as mapping 200. For example, the mapping 200 is a mapping of physical memory addresses that is 11 bits and includes an 8 bit word line and a 3 bit string number for each physical memory address. In some embodiments, the first lookup table 120 is stored in the memory device 104 of the data storage device 102.

When the physical memory address is retrieved, the processor 124 generates a plurality of encoded values (at block 404). In some embodiments, a plurality of encoded values are generated by encoding the plurality of physical memory addresses. In some embodiments, the encoded value column 210 includes 10 bits of data that corresponds to 800 physical memory address entries that are used. In some embodiments, the plurality of encoded values corresponds to the physical memory addresses that are used. For example, for each word line, such as 0 at word line 201 described above with respect to FIG. 2, 5 out of the available 8 entries may be used, such that 3 physical memory address entries are unused space in the memory device 104 of the data storage device 102.

Once the plurality of encoded values are generated, the plurality of encoded values are stored in the first lookup table 120 (at block 406). In some embodiments, the encoded values are stored in the first lookup table 120 as an encoded value column, such as encoded value column 210 described above. For example, an encoded value of 5 is provided at WL 00000001 STR 000 (e.g., "1" at word line 201, "0" at string number 202) because WL 00000007 STR 000 is the fifth physical memory address entry in the first lookup table 120 that is used.

When the plurality of encoded values are generated, the processor 124 generates a second lookup table, such as second lookup table 128 (at block 408). The second lookup table 128 is a mapping of logical addresses to the encoded values. In some embodiments, the second lookup table 128 includes 10 bits of data that corresponds to 800 physical memory address entries that are used in the memory device 104. In some embodiments, the second lookup table 128 includes an encoded value column, similar to the encoded value column 210 of the first lookup table 120. When the second lookup table 128 is generated, the processor 124 stores the second lookup table to the memory 126 (at block 410). Alternatively, in some embodiments, the second lookup table 128 is stored in the memory device 104 of the data storage device 102, and used by the processor 124.

In some embodiments, the processor 124 may be configured to update the second lookup table 128 when new data is written to the memory device 104. For example, the processor 124 may receive a plurality of logical addresses from the host 108. The plurality of logical addresses may be associated with data to be written to the memory device 104 of the data storage device 102. Once the plurality of logical addresses are received, the processor 124 may update the second lookup table 128 include the plurality of logical addresses. In some embodiments, updating the second lookup table 128 may include associating the plurality of encoded values with the plurality of logical addresses that is received.

Figure 5:
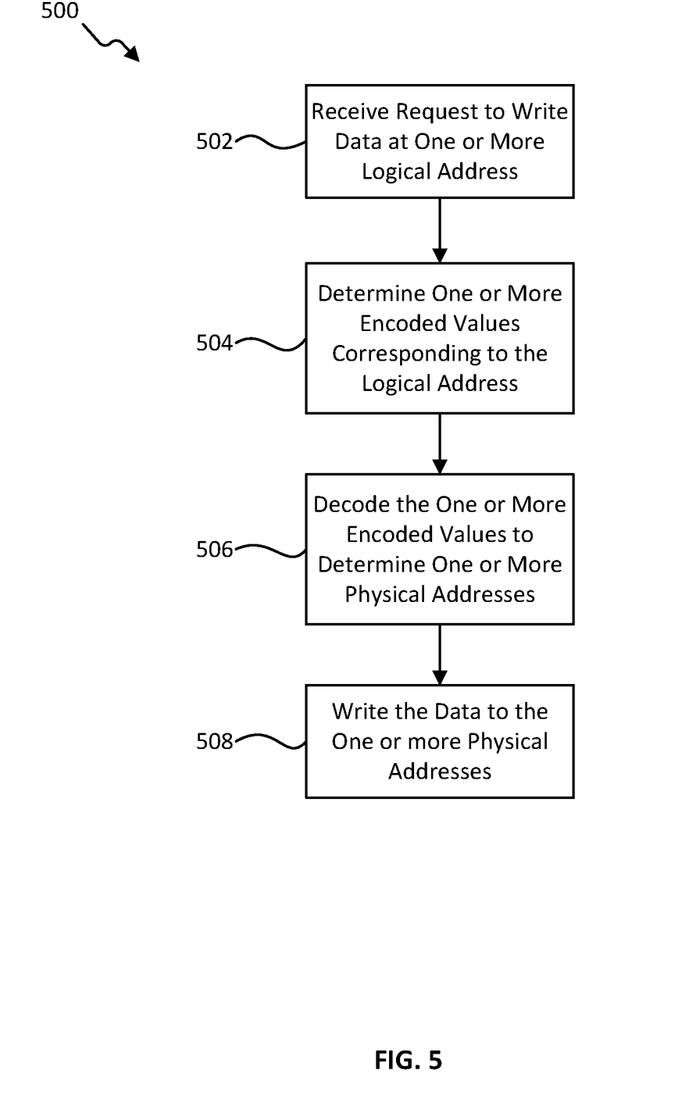
FIG. 5 is a flowchart illustrating a process for writing data to a physical memory address using the second lookup table, according to some embodiments.

Turning now to FIG. 5, a process 500 for writing data to a physical memory address using the second lookup table 128 is described, according to some embodiments. It is understood that the process 500 can be stored in a memory, such as memory 126, and executed by a processor, such as processor 124. However, it is contemplated that some or all of the process 500 may be performed on the memory device 104, such as via the read/write circuitry 122. Accordingly, while the process 500 is described in regards to the controller 106 and its associated components described above, it is contemplated that the process 500 may be at least partially performed by the memory device 104 or other suitable memory component.

The processor 124 receives a request to write data at one or more logical addresses (at block 502). In some embodiments, the processor 124 may receive a request from a host device 108 to write the data at the one or more logical addresses. For example, the host device 108 may request a first byte of data to be written. Once a request to write data at one or more logical addresses has been received, the processor 124 determines one or more encoded values corresponding to the logical address (at block 504). In some embodiments, the processor 124 may reference the second lookup table 128 stored in the memory 126 to determine the encoded value corresponding to the logical address. For example, the processor 124 may determine that the first byte of data is to be written at encoded value entry 6.

Once the encoded value corresponding to the logical address is determined, the processor 124 decodes the one or more encoded values to determine one or more physical memory addresses (at block 506). In some embodiments, the processor 124 references the first lookup table 120 in the memory device 104 to determine a physical memory address (e.g., a word line and string number) that corresponds to the one or more encoded values in the encoded value column 210. For example, when the encoded value entry number is determined to be entry 6, the processor 124 may reference entry 6 of the encoded value column 210 in the first lookup table 120 to determine that the first byte of data to be written to is at WL 00000001 STR 001 (e.g., "1" at word line 201, "1" at string number 202).

When the one or more encoded values are decoded to determine one or more physical memory addresses, the processor 124 writes the data to the one or more physical memory addresses (at block 508). In some embodiments, the data is written in the memory device 104. For example, the first byte of data is written at WL 00000001 STR 001 (e.g., "1" at word line 201, "1" at string number 202) in the memory device 104.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device, comprising:
a non-volatile memory; and
a controller including a memory and an electronic processor, the controller coupled to the non-volatile memory, and the electronic processor configured to:
retrieve a plurality of physical memory addresses from a first lookup table in the non-volatile memory, wherein each physical memory address is a combination of a word line and a string number of the non-volatile memory, the each physical memory address has a first number of bits,
generate a plurality of encoded values by encoding the plurality of physical memory addresses, each of the plurality of encoded values has a second number of bits that is smaller than the first number of bits,
store the plurality of encoded values in the first lookup table,
generate a logical to encoded value look-up table with the plurality of encoded values, and
store the logical to encoded value look-up table in the memory.

2. The data storage device of claim 1, wherein the controller is further configured to:
receive a plurality of logical addresses, and
update the logical to encoded value look-up table with the plurality of logical addresses.

3. The data storage device of claim 2, wherein the controller is further configured to:
receive a request to write data to one or more of the plurality of logical addresses,
determine one or more encoded values corresponding to the one or more of the plurality of logical addresses,
decode the one or more encoded values to determine one or more physical memory addresses, and
control the non-volatile memory to write the data to the one or more physical memory addresses.

4. The data storage device of claim 2, wherein the controller is further configured to:
receive a request to read data at one or more of the plurality of logical addresses,
determine one or more encoded values corresponding to the one or more of the plurality of logical addresses,
decode the one or more encoded values to determine one or more physical memory addresses, and
control the non-volatile memory to output the data from the one or more physical memory addresses.

5. The data storage device of claim 1, wherein the plurality of physical memory addresses are physical memory addresses that are configured to be used in the non-volatile memory.

6. The data storage device of claim 1, wherein the first number of bits is 11 bits and the second number of bits is 10 bits.

7. The data storage device of claim 1, wherein the plurality of encoded values includes values from 0 to 799.

8. A method comprising:
retrieving, with a data storage controller, a plurality of physical memory addresses from a first lookup table in a non-volatile memory, wherein each physical memory address is a combination of a word line and a string number of the non-volatile memory, the each physical memory address has a first number of bits,
generating, with the data storage controller, a plurality of encoded values by encoding the plurality of physical memory addresses, each of the plurality of encoded values has a second number of bits that is smaller than the first number of bits,
storing, with the data storage controller, the plurality of encoded values in the first lookup table,
generating, with the data storage controller, a logical to encoded value look-up table with the plurality of encoded values, and
storing, with the data storage controller, the logical to encoded value look-up table in a memory of the data storage controller.

9. The method of claim 8 further comprising:
receiving, with the data storage controller, a plurality of logical addresses; and
updating, with the data storage controller, the logical to encoded value look-up table with the plurality of logical addresses.

10. The method of claim 9 further comprising:
receiving, with the data storage controller, a request to write data to one or more of the plurality of logical addresses,
determining, with the data storage controller, one or more encoded values corresponding to the one or more of the plurality of logical addresses,
decoding, with the data storage controller, the one or more encoded values to determine one or more physical memory addresses, and
controlling, with the data storage controller, the non-volatile memory to write the data to the one or more physical memory addresses.

11. The method of claim 9 further comprising:
receiving, with the data storage controller, a request to read data at one or more of the plurality of logical addresses,
determining, with the data storage controller, one or more encoded values corresponding to the one or more of the plurality of logical addresses,
decoding, with the data storage controller, the one or more encoded values to determine one or more physical memory addresses, and
controlling, with the data storage controller, the non-volatile memory to output the data from the one or more physical memory addresses.

12. The method of claim 8, wherein the plurality of physical memory addresses are physical memory addresses that are configured to be used in the non-volatile memory.

13. The method of claim 8, wherein the first number of bits is 11 bits and the second number of bits is 10 bits.

14. The method of claim 8, wherein the plurality of encoded values includes values from 0 to 799.

15. A non-transitory computer readable medium including instructions that, when executed by a data storage controller, causes the data storage controller to execute a set of operations, the set of operations comprising:
retrieving a plurality of physical memory addresses from a first lookup table in a non-volatile memory, wherein each physical memory address is a combination of a word line and a string number of the non-volatile memory, the each physical memory address has a first number of bits,
generating a plurality of encoded values by encoding the plurality of physical memory addresses, each of the plurality of encoded values has a second number of bits that is smaller than the first number of bits,
storing the plurality of encoded values in the first lookup table,
generating a logical to encoded value look-up table with the plurality of encoded values, and
controlling a memory of the data storage controller to store the logical to encoded value look-up table.

16. The non-transitory computer readable medium of claim 15, wherein the set of operations further include
receiving a plurality of logical addresses; and
updating the logical to encoded value look-up table with the plurality of logical addresses.

17. The non-transitory computer readable medium of claim 16, wherein the set of operations further include
receiving a request to write data to one or more of the plurality of logical addresses,
determining one or more encoded values corresponding to the one or more of the plurality of logical addresses,
decoding the one or more encoded values to determine one or more physical memory addresses, and
controlling the non-volatile memory to write the data to the one or more physical memory addresses.

18. The non-transitory computer readable medium of claim 16, wherein the set of operations further include
receiving a request to read data at one or more of the plurality of logical addresses,
determining one or more encoded values corresponding to the one or more of the plurality of logical addresses,
decoding the one or more encoded values to determine one or more physical memory addresses, and
controlling the non-volatile memory to output the data from the one or more physical memory addresses.

19. The non-transitory computer readable medium of claim 15, wherein the plurality of physical memory addresses are physical memory addresses that are configured to be used in the non-volatile memory.

20. The non-transitory computer readable medium of claim 15, wherein the first number of bits is 11 bits and the second number of bits is 10 bits.

* * * * *